(12) United States Patent
Glaesman

(10) Patent No.: US 11,651,875 B2
(45) Date of Patent: May 16, 2023

(54) ELECTRICAL BUSHINGS HAVING MOLDED IN SCREENS AND METHODS OF MAKING

(71) Applicant: HUBBELL INCORPORATED, Shelton, CT (US)

(72) Inventor: Peter Wayne Glaesman, Goldsboro, NC (US)

(73) Assignee: Hubbell Incorporated, Shelton, CT (US)

( * ) Notice: Subject to any disclaimer, the term of this patent is extended or adjusted under 35 U.S.C. 154(b) by 248 days.

(21) Appl. No.: 16/890,908

(22) Filed: Jun. 2, 2020

(65) Prior Publication Data

US 2020/0381148 A1 Dec. 3, 2020

Related U.S. Application Data

(60) Provisional application No. 62/856,419, filed on Jun. 3, 2019.

(51) Int. Cl.
*H01B 17/30* (2006.01)
*G01R 19/145* (2006.01)
*H01F 27/04* (2006.01)

(52) U.S. Cl.
CPC ......... *H01B 17/306* (2013.01); *G01R 19/145* (2013.01); *H01F 27/04* (2013.01)

(58) Field of Classification Search
CPC ...... H01B 17/306; H01B 17/28; H01B 17/26; H01B 17/30; G01R 19/145; H01F 27/04; H01F 27/2828; H01F 27/02; H01R 13/53; H01R 4/70; H02G 15/072; H01H 9/0264; H01H 9/02; H01H 85/185

USPC ........ 174/152 R, 142, 152 G, 153 G, 138 R, 174/139, 138 F, 137 R, 5 R, 14 BH, 31 R, 174/209; 16/2.1, 2.2

See application file for complete search history.

(56) References Cited

U.S. PATENT DOCUMENTS

| | | | | |
|---|---|---|---|---|
| 2,155,846 A * | 4/1939 | Smith | ................... | H01B 17/28 174/31 R |
| 3,257,501 A * | 6/1966 | Louis | ................... | H01B 17/525 174/209 |
| 4,505,033 A * | 3/1985 | Wheeler | ................. | B29C 43/18 174/152 R |
| 4,965,407 A * | 10/1990 | Hamm | ................... | H01B 17/26 174/31 R |
| 5,726,390 A * | 3/1998 | Schweppe | ............ | H01B 17/005 174/152 R |
| 6,346,677 B1 * | 2/2002 | Guillemette | ........... | H01B 17/26 174/152 R |
| 6,538,422 B2 | 3/2003 | Potter | | |
| 7,494,355 B2 | 2/2009 | Hughes | | |
| 8,861,165 B2 * | 10/2014 | Kampe | ................. | H01B 17/16 174/18 |

(Continued)

*Primary Examiner* — Angel R Estrada
(74) *Attorney, Agent, or Firm* — Ruggiero, McAllister & McMahon LLC

(57) ABSTRACT

An electrical bushing is provided that includes a conductor, a conductive polymer screen, and an insulating body. The conductive polymer screen has a first region and a second region. The insulating body is molded over at least a portion of the conductor and is molded over the first region of the screen. The second region of the screen extends outward from the insulating body to define an exterior flange.

19 Claims, 14 Drawing Sheets
(7 of 14 Drawing Sheet(s) Filed in Color)

(56) References Cited

U.S. PATENT DOCUMENTS

| | | | | |
|---|---|---|---|---|
| 8,952,257 B2* | 2/2015 | Dais | ................ | H01F 27/04 |
| | | | | 174/80 |
| 9,947,442 B2* | 4/2018 | Engels | ................ | H02G 3/083 |
| 10,115,547 B2 | 10/2018 | Gerovac | | |
| 10,210,969 B2* | 2/2019 | Sjöberg | ................ | H01B 17/34 |
| 10,283,242 B2* | 5/2019 | Sumimoto | ................ | H01B 17/26 |
| 11,146,053 B2* | 10/2021 | Dhlamini | ................ | H01F 27/04 |

\* cited by examiner

ELECTRICAL BUSHINGS HAVING MOLDED IN SCREENS AND METHODS OF MAKING

CROSS REFERENCE TO RELATED APPLICATIONS

This application claims the benefit of U.S. Provisional Application 62/856,419 filed Jun. 3, 2019, the entire contents of which are incorporated by reference herein

BACKGROUND

1. Field of the Invention

The present disclosure is related to electrical bushings. More particularly, the present disclosure is related to electrical bushings having molded in screens and methods of making.

2. Description of Related Art

Power distribution systems are used to transmit electrical power from power sources via power lines to electric devices such as, but not limited to, switch gear, capacitors, transformers, and others.

Separable insulated connector systems—commonly referred to as electrical bushings—have been developed that allow ready connection and disconnection of the power lines with the electrical devices. Separable connector systems are available in both dead break form (e.g., connectors that allow connection/disconnection when there is no electrical load) and load break form (e.g., connectors that allow connection/disconnection under electrical load).

The requirements for separable insulated connector systems are generally set out in IEEE 386-2016, which is the standard for separable insulated connector systems for power distribution systems rated 2.5 kV through 35 kV. This standard establishes definitions, service conditions, ratings, interchangeable construction features, and tests for load break and dead break separable insulated connector systems rated 900 A or less for use on shielded power distribution systems rated 2.5 kV through 35 kV. IEEE 386-2016 is incorporated by reference herein.

It is common for the power lines to pass through a grounded plane, namely through metal walls, cabinets, and enclosures, at the electrical bushing. It has been found that passing voltage through a grounded plane at the bushing can result in voltage stress in the bushing and/or can result in partial discharge (PD) at a voltage below the extinction level specified in the aforementioned standard. As a result, prior art bushings have been developed that have various conductive coatings and insulating geometries to prevent these stresses and/or discharges.

However, it has been determined by the present disclosure that there is a need for electrical bushings and methods that improve upon, overcome, alleviate, and/or mitigate one or more of the aforementioned and other deleterious effects of prior art electrical bushings.

SUMMARY

An electrical bushing is provided that includes a conductor, a conductive polymer screen, and an insulating body. The conductive polymer screen has a first region and a second region. The insulating body is molded over at least a portion of the conductor and is molded over the first region of the screen. The second region of the screen extends outward from the insulating body to define an exterior flange.

In some embodiments either alone or together with any one or more of the aforementioned and/or after-mentioned embodiments, the insulating body is made of epoxy.

In some embodiments either alone or together with any one or more of the aforementioned and/or after-mentioned embodiments, the epoxy is cycloaliphatic epoxy.

In some embodiments either alone or together with any one or more of the aforementioned and/or after-mentioned embodiments, the conductive polymer screen is ethylene propylene diene monomer rubber.

A method of forming an electrical bushing is also provided. The method includes seating a screen in a cup portion of a mold so that an outer surface of the screen is seated against an inner surface of the cup portion; inserting a conductor into the mold and through the screen; closing the mold; and injecting an insulator material into the mold so that the insulator material flows through holes in a first region of the screen, the insulator material forming an insulator body over at least a portion of the conductor and over the first region of the screen, the outer surface forming part of a second region of the screen that extends outward from and over an outer portion of the insulating body.

The above-described and other features and advantages of the present disclosure will be appreciated and understood by those skilled in the art from the following detailed description, drawings, and appended claims.

BRIEF DESCRIPTION OF THE DRAWINGS

This application contains at least one drawing executed in color. Copies of this patent or patent application publication with color drawing(s) will be provided by the Office upon request and payment of the necessary fee.

DETAILED DESCRIPTION

Figure 1:
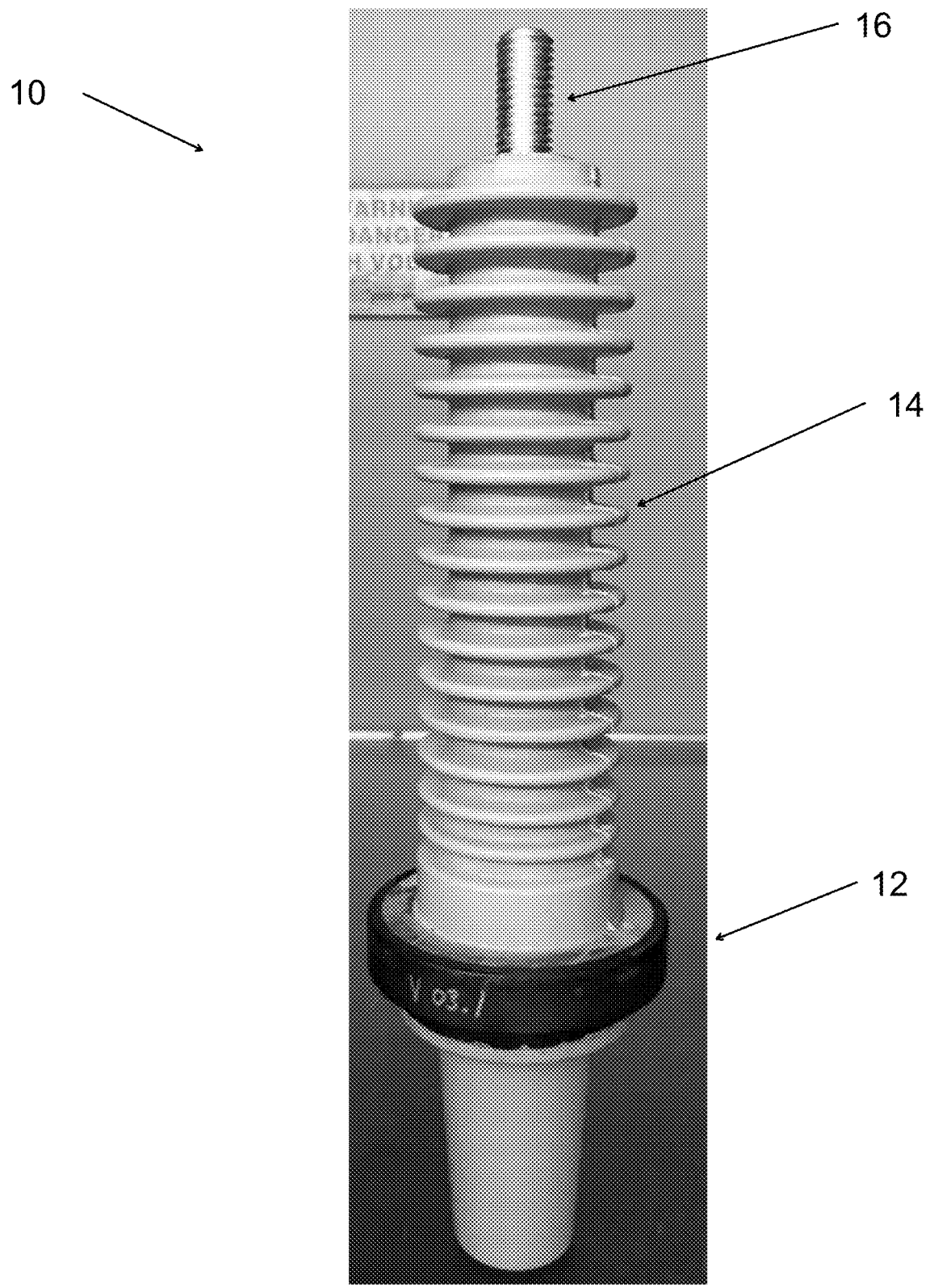
FIG. 1 is a perspective view of an exemplary embodiment of an electrical bushing according to the present disclosure.
Figure 2:
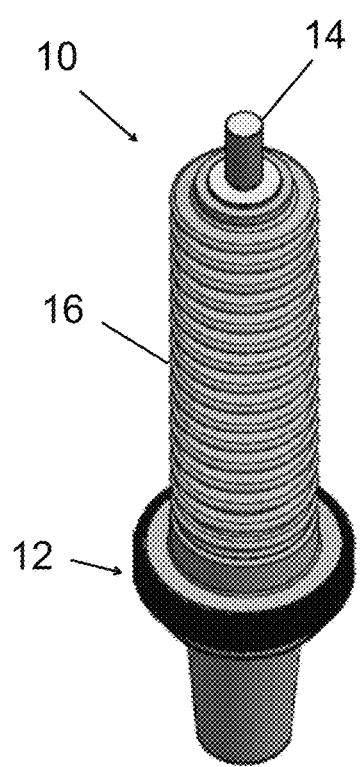
FIG. 2 is a second perspective view of the electrical bushing of FIG. 1.
Figure 3:
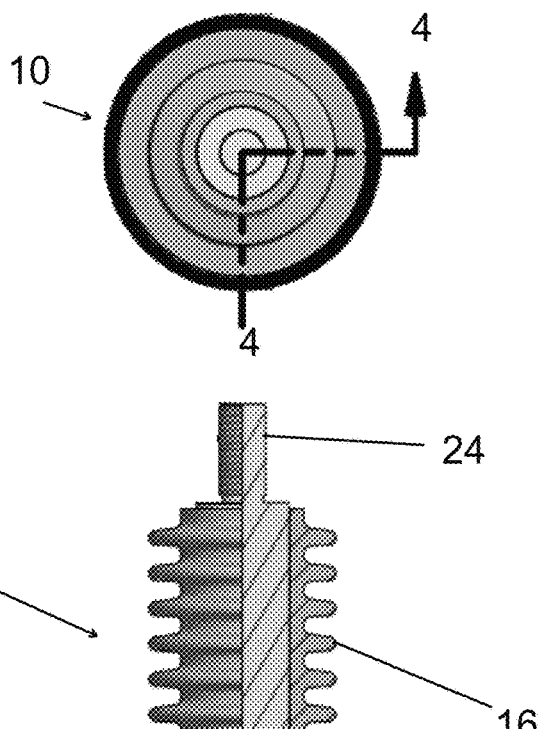
FIG. 3 is a top view of the electrical bushing of FIG. 1.
Figure 4:
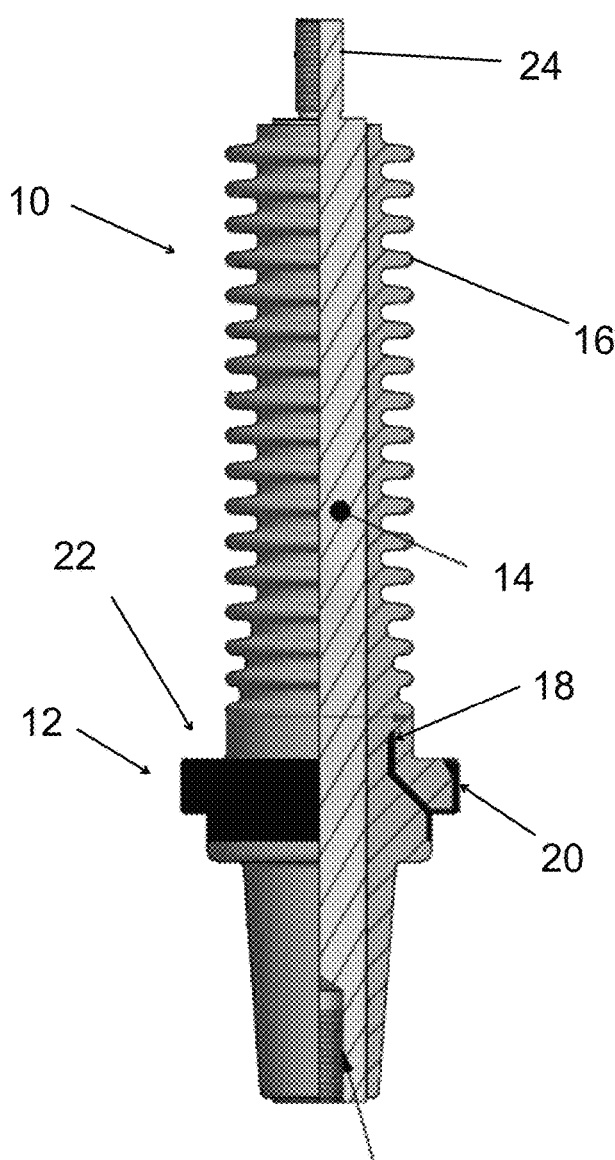
FIG. 4 is a partial sectional view of the electrical bushing of FIG. 1 taken along line 4-4 in FIG. 3.

Referring to the drawings and in particular to FIGS. 1-4, an exemplary embodiment of an electrical bushing according to the present disclosure is shown and is generally referred to by reference numeral 10.

Advantageously, bushing 10 includes a molded-in screen 12, which is formed of conductive polymer. Bushing 10 is simply formed—and in some embodiments—includes only three components, namely screen 12, conductor 14, and an insulating body 16.

Insulating body 16 is molded over at least a portion of conductor 14 and over a first region 18 of screen 12, while a second region 20 of the screen extends outward from the insulating body and defines an exterior flange 22. In this manner, first region 12 of screen 12 functions as an embedded shield that is configured to shape the electrical field, mitigate partial discharge (PD), spread the voltage drop across a larger area of a surface of insulating body 16, and reduce voltage stress. Further, second region 20 of screen 12 functions as an external grounding feature of bushing 10.

As used herein, the term "molded over" shall be understood to mean that the insulating body 16, the portion of the conductor 14, and the first region 18 of screen 12 form single integral unit with the portion of the conductor 14 and the first region 18 being encased or embedded in the insulating body 16. The molding over of the present disclosure can be accomplished by any desired method using processes including but not limited to insert molding, double shot molding, co-injection molding, and others.

In the illustrated embodiment, conductor 14 is illustrated as having a male post 24 at one end and a female outlet 26 at the opposite end. Moreover, conductor 14 is illustrated as a shaft with male post 24 as a threaded stud and female outlet 26 as a threaded outlet. Here, insulating body 16 is molded over female outlet 26, leaving male post 24 exposed.

Of course, it is contemplated by the present disclosure for conductor 14 to have any desired shape—such as but not limited to a rectangular conductor bar. Further, it is contemplated by the present disclosure for conductor 14 to have two female outlets, two male posts, or other bar end configurations. It is contemplated by the present disclosure for conductor 14 to have unthreaded posts/outlets.

Figure 5:
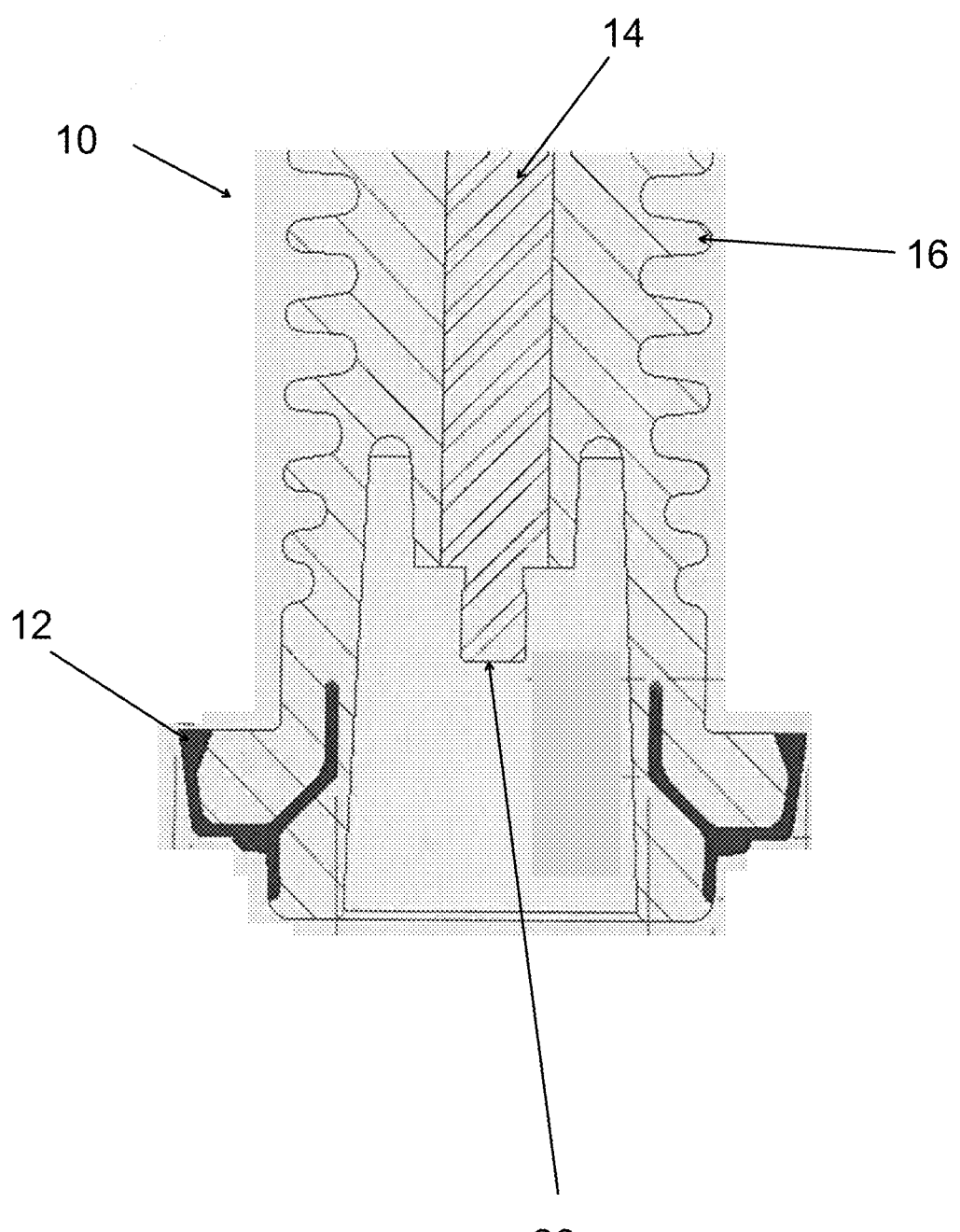
FIG. 5 is a partial sectional view of an alternate configuration of the electrical bushing of FIG. 1.
Figure 6:
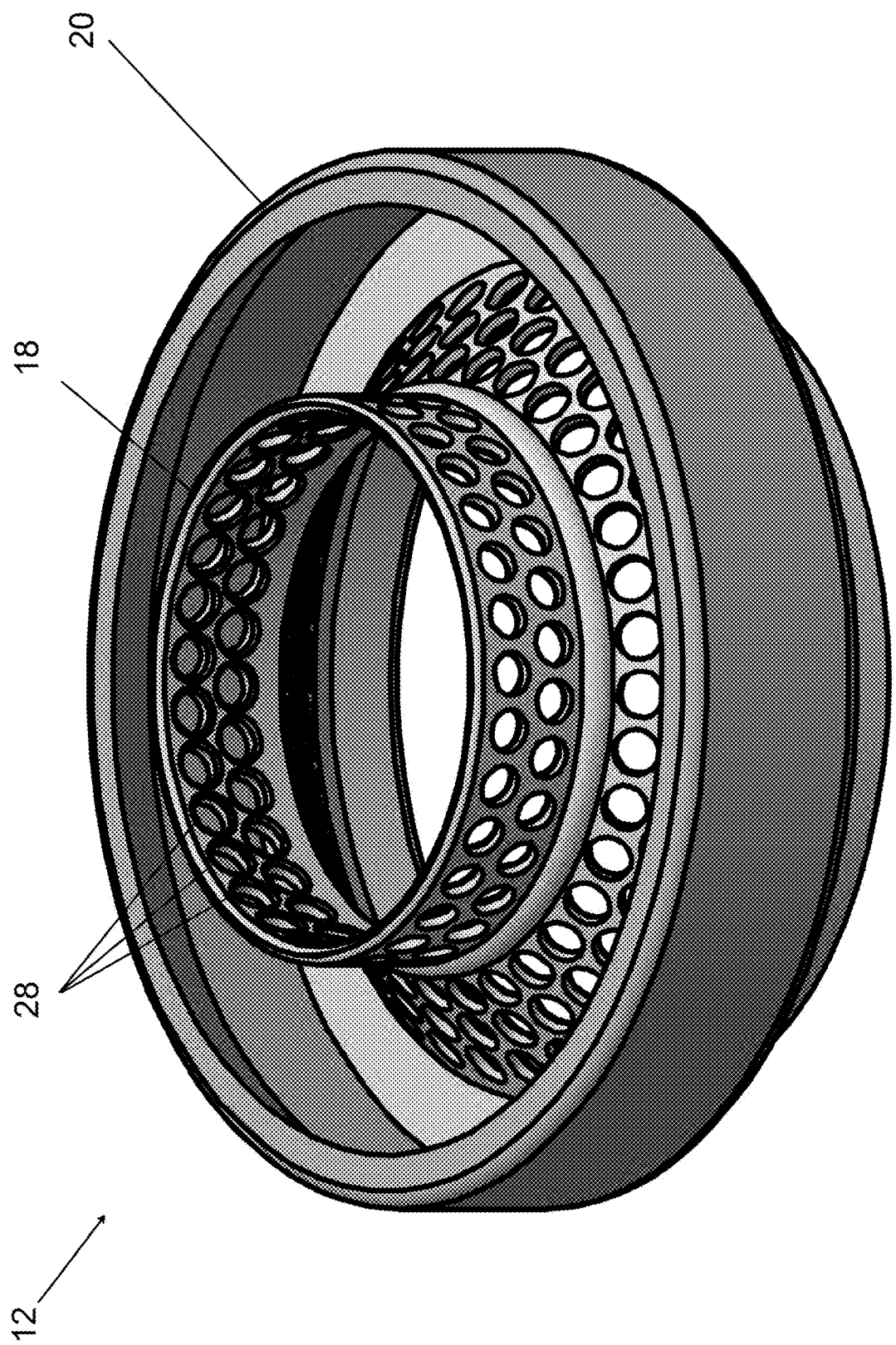
FIG. 6 is a perspective view of a screen of the electrical bushing of FIG. 1.
Figure 7:
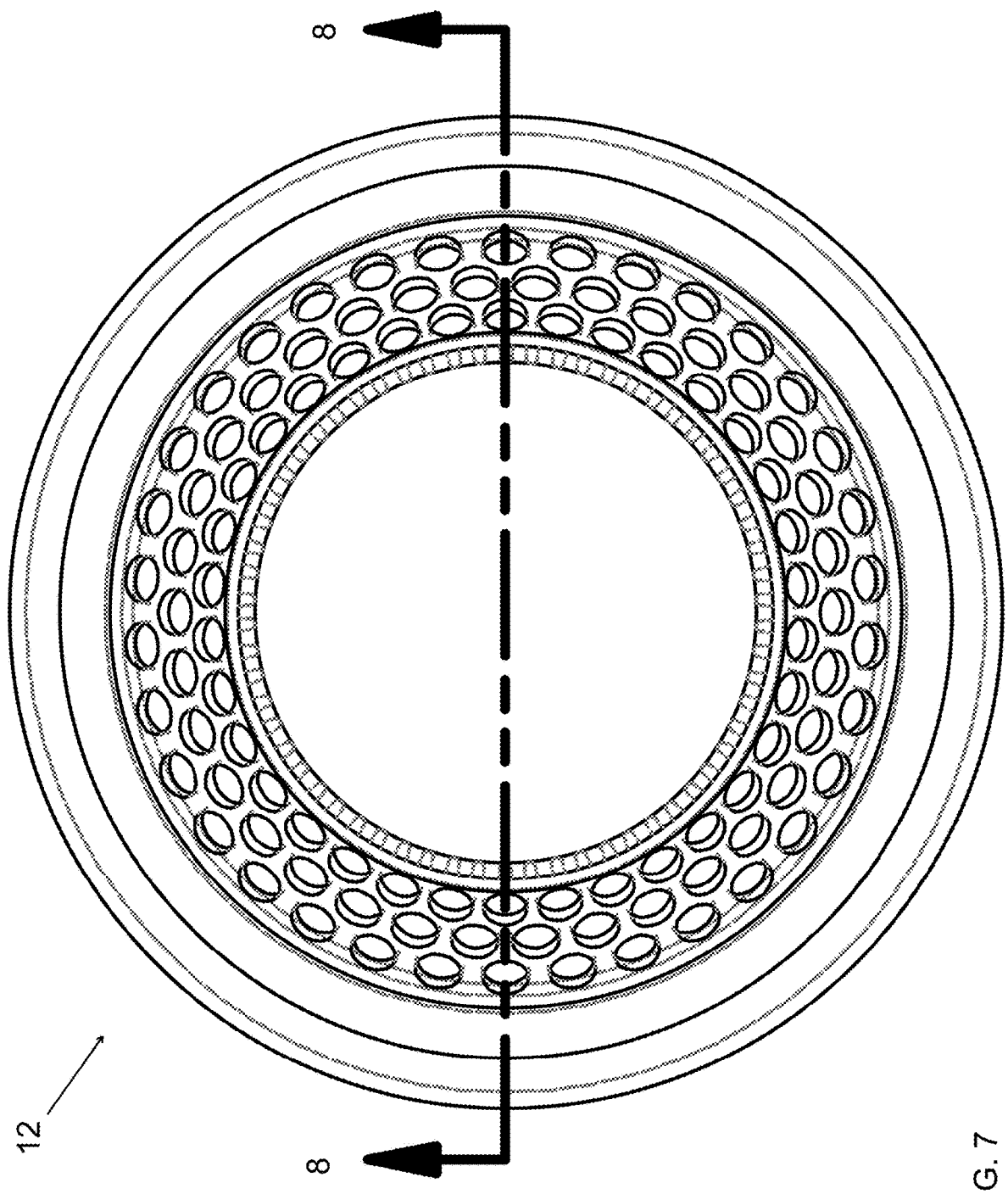
FIG. 7 is a top view of the screen of FIG. 6.
Figure 8:
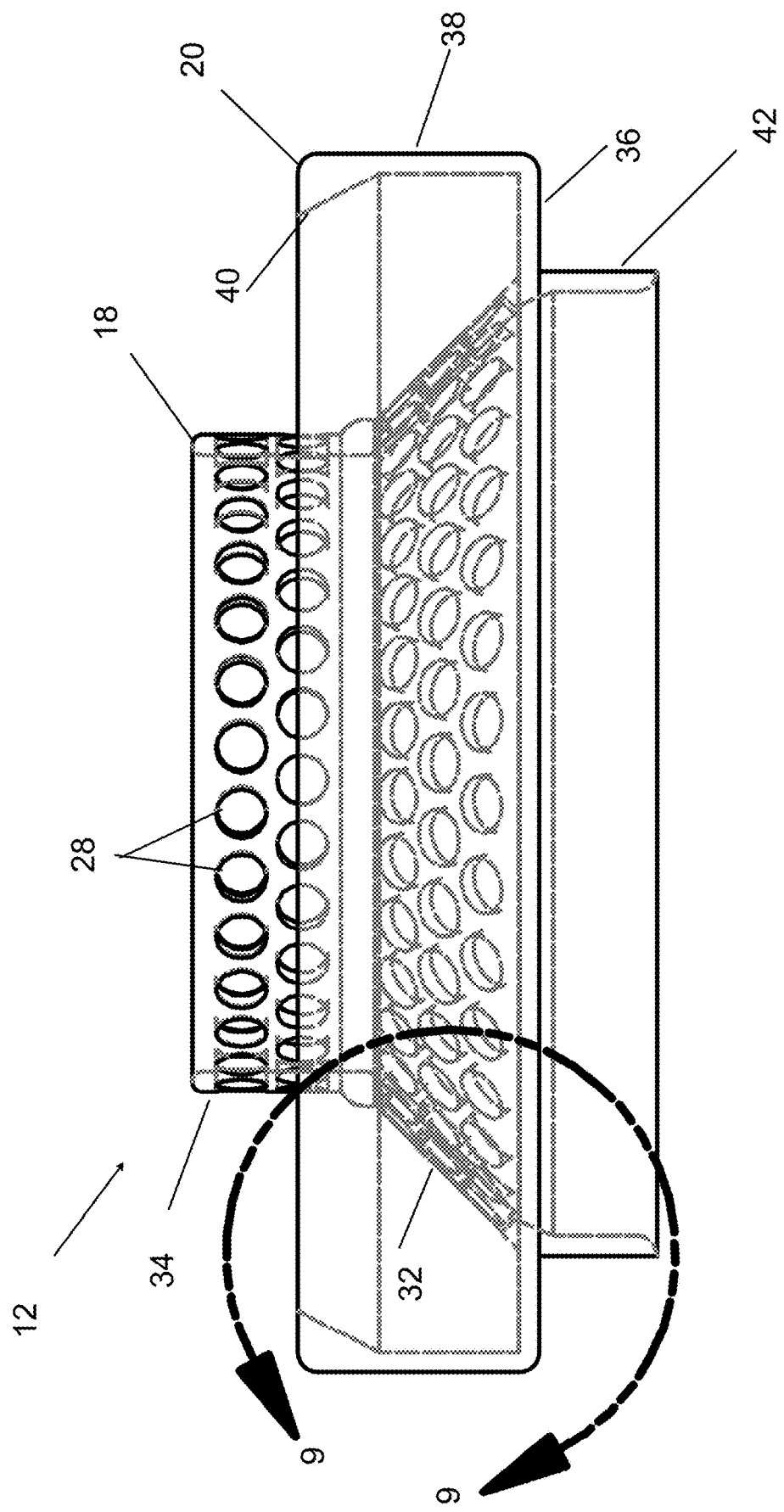
FIG. 8 is a sectional view of the screen taken along line 8-8 in FIG. 7.
Figure 9:
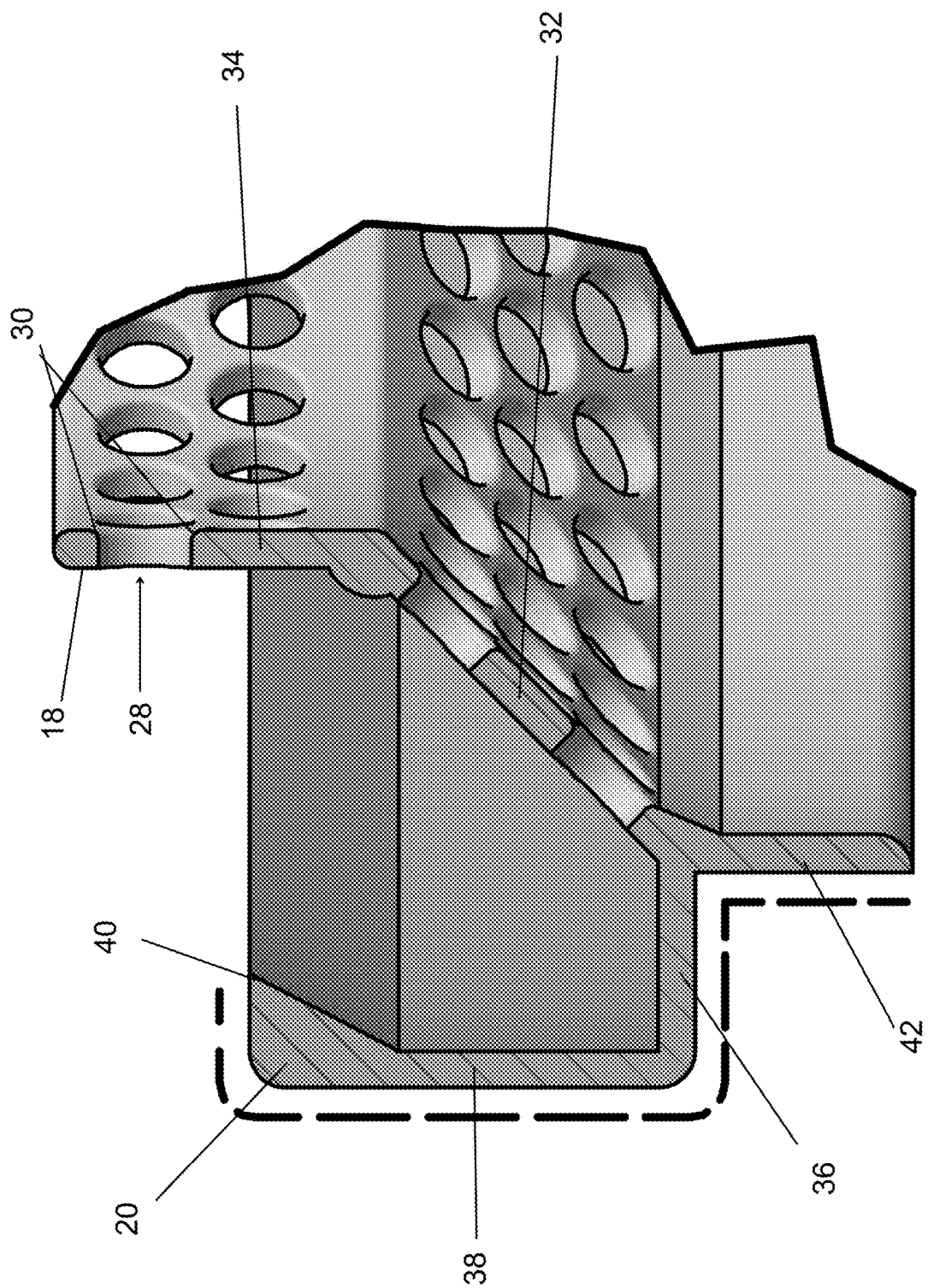
FIG. 9 is an enlarged partial sectional view of the screen taken along line 9-9 in FIG. 8.

For example and as illustrated in FIG. 5, bushing 10 can have outlet 26 configured with a male post, which is a common configuration for use with 200 amp feeds.

Conductor 14 can be made of and/or plated with any conductive material such as, but not limited to, copper, silver, aluminum, gold, tin, nickel, steel, and any alloys thereof.

Insulating body 16 can be made of any insulating material such as, but not limited to, a polymer material, an epoxy material, and any mixtures thereof. In one embodiment, conductor 14 is made of copper or aluminum and insulating body 16 is made of cycloaliphatic epoxy resin-based material and is molded over the conductor and screen 12 using a pressure gelation process.

Screen 12 is discussed in more detail with reference to FIGS. 6-9. Screen 12 is configured, via geometry, to allow a close-tolerance fit in the mold tooling of bushing 10 and to balance the peak external electrical stresses identified by boundary element analysis as disclosed in more detail below.

Screen 12 is molded of a conductive polymer—more preferably of a conductive elastomer. As used herein, the terms "conductive polymer" and/or "conductive elastomer" shall mean any polymer/elastomer material with a conductivity of between about 1 to about 300 ohm/cm. The polymer itself can be conductive and/or the polymer can be mixed with a conductive filler such as, but not limited to, one or more of silver, aluminum, silver, copper, nickel, graphite, carbon black, and others.

In some embodiments, screen 12 is an injection molded screen made of a conductive elastomer such as, but not limited to, natural rubber, synthetic rubber, vulcanized rubber, nitrile rubber, also known as NBR, Buna-N, and acrylonitrile butadiene rubber, silicone, fluorosilicone, ethylene propylene diene monomer (EPDM), and others.

In one embodiment, screen 12 is made of an injection molded ethylene propylene diene monomer rubber (EPDM).

In other embodiments, screen 12 can be formed from a high temperature nylon core that is coated with a conductive polymer coating.

Screen 12 is illustrated as being configured for all 15 kV, 25 kV, and 35 kv rated 600 amp and 200 amp versions of the bushing 10—where the bushing has conductor 16 in the form of a shaft with a circular cross section.

First region 18 is embedded within insulating body 16 preferably by over-molding. First region 18 can include a plurality of relief holes 28 that allow material of insulating body 16 to flow through and secure screen 12 in a desired location within insulating body 16. Further, holes 28 can be configured—by size, shape, pattern and combinations thereof—to assist in shaping the electrical field. In some embodiments, holes 28 include a radiused edge 30 that faces internal to screen 12.

First region 18 has a radial portion 32 that extends radially outward away from conductor 14. In the illustrated embodiment, radial portion 32 is frusto-conical in shape, namely has both a radial component with a constant slope and a longitudinal component. First region 18 also has a longitudinal portion 34 that extends around conductor 14 along the longitudinal axis. In the illustrated embodiment, longitudinal portion 34 is a cylinder.

Of course, it should be recognized that radial portion 32 can lack any longitudinal component or for the slope of the longitudinal component to be variable. Further, it is contemplated by the present disclosure for longitudinal portion 34 to have a radial component namely to vary in distance from conductor 14 along the longitudinal axis.

Second region 20 of screen 12 includes a radial portion 36 and a longitudinal portion 38 that define exterior flange 22. In some embodiments, longitudinal portion 38 further includes a bevel 40 at the free end to assist in securing second region 20 around flange 22 and provide additional grounding surface on top of the flange. In some embodiments, second region 20 can further include another longitudinal portion 42 extending along the longitudinal axis in a direction away from flange 22.

It should be recognized that screen 12 is illustrated by way of example as being configured for use with conductor 14 of a circular cross section. Of course, it is contemplated by the present disclosure for screen 12 to configured for use with a conductor 14 of a non-circular cross section.

Figure 10:
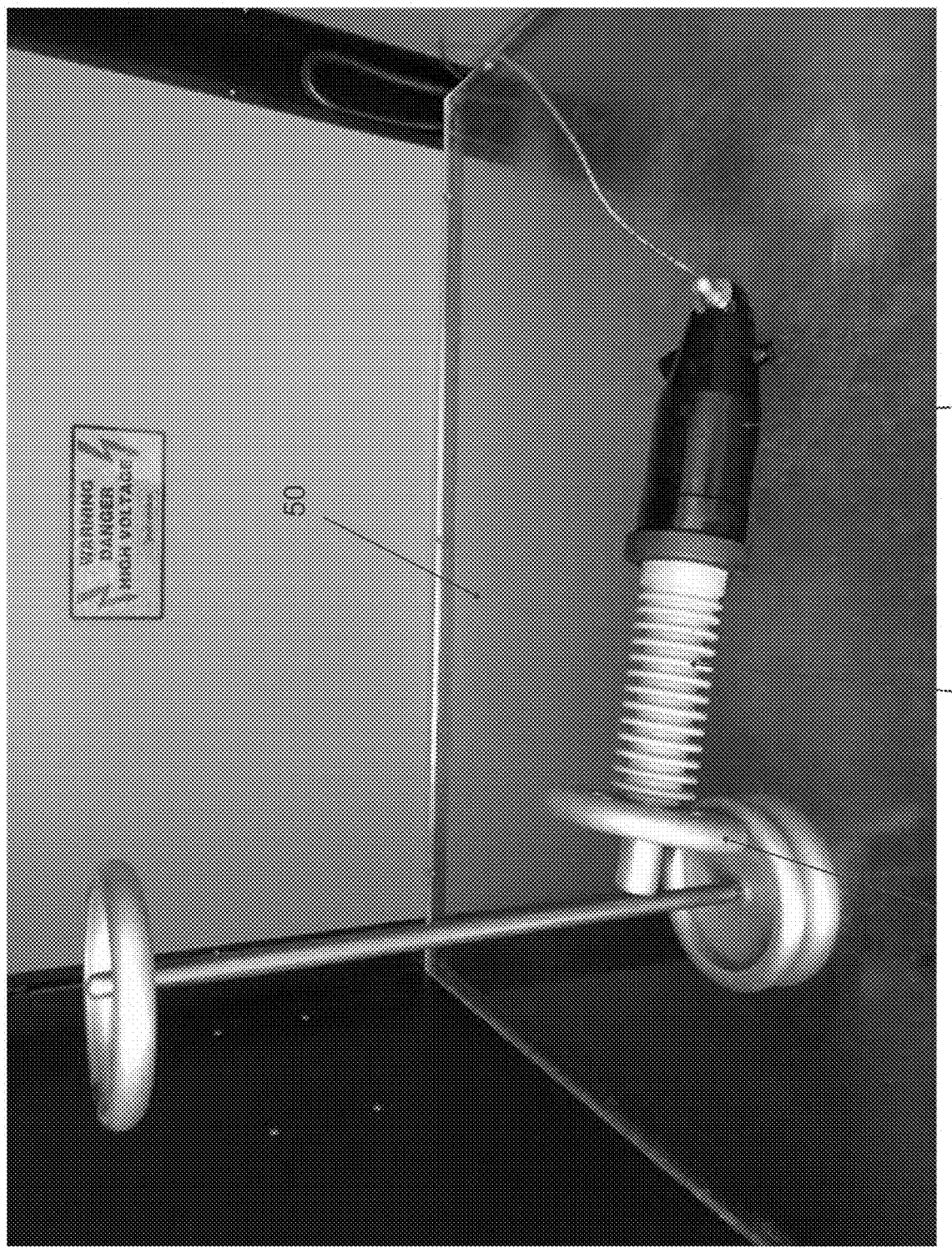
FIG. 10 illustrates a test station for testing partial discharge and voltage stress.

Referring now to FIG. 10, a test station 50 is shown that is configured to test for partial discharge and voltage stress. Test station 50 includes a mating insulation cap 52 and an energizing top cap 54. Testing station 50 is illustrated in FIG. 10 connected to bushing 10 of FIG. 1.

Test station 50 was used to compare performance of bushing 10 to a prior art bushing (not shown). Specifically, test station 50 was used to compare bushing 10 to a commercially available universal air bushing made by REUEL (Catalog ID: U-UAB95), which lacks screen 12, but instead has a painted conductive coating over the flange.

Here, bushing 10 and the prior art bushing are 600-amp aluminum conductor bushings rated for 15 kV and 95 kV basic impulse load (BIL) and have a top threaded stud 24. Thus, in these tests, bushing 10 and the prior art bushing were energized at top cap 54 through threaded stud 24.

Figure 11:
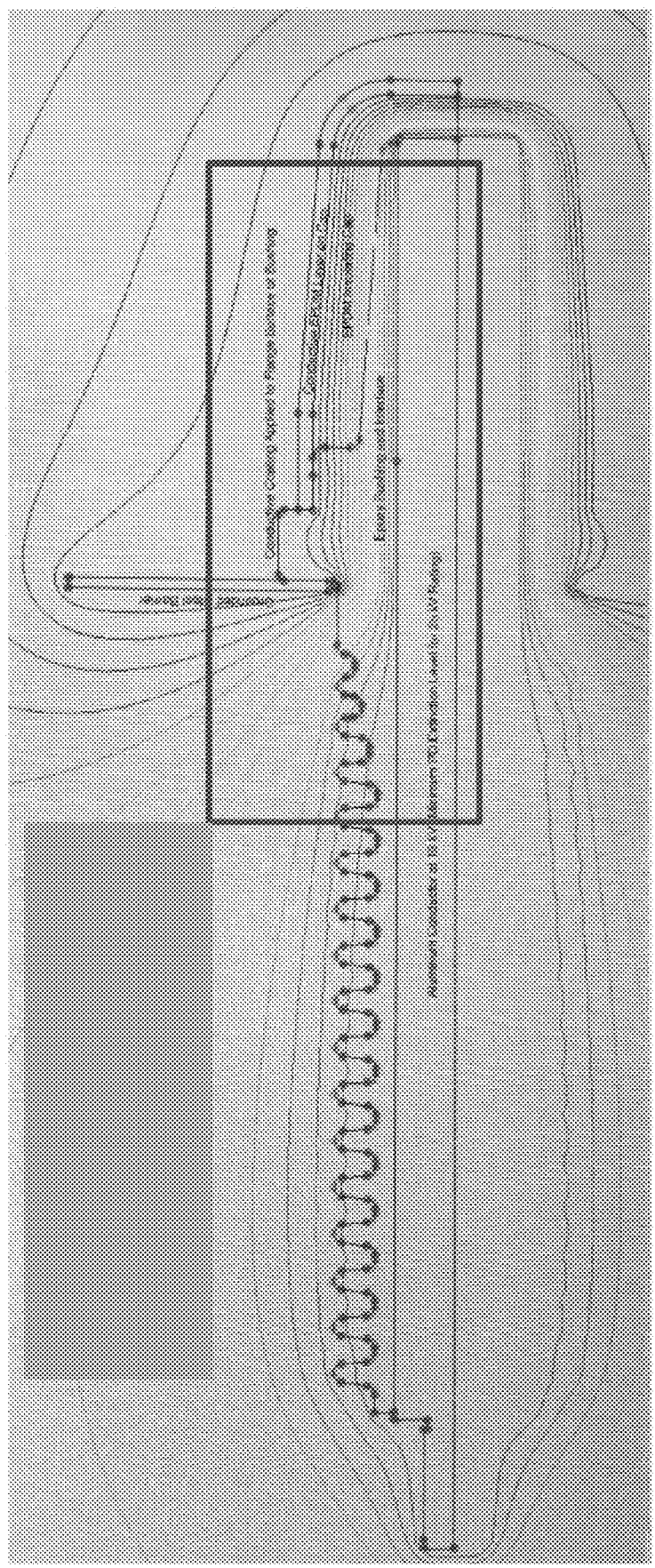
FIG. 11 illustrates the electrical stress predicted by a boundary element analysis simulating voltage contours resulting from the test station of FIG. 10 testing a prior art bushing.
Figure 12:
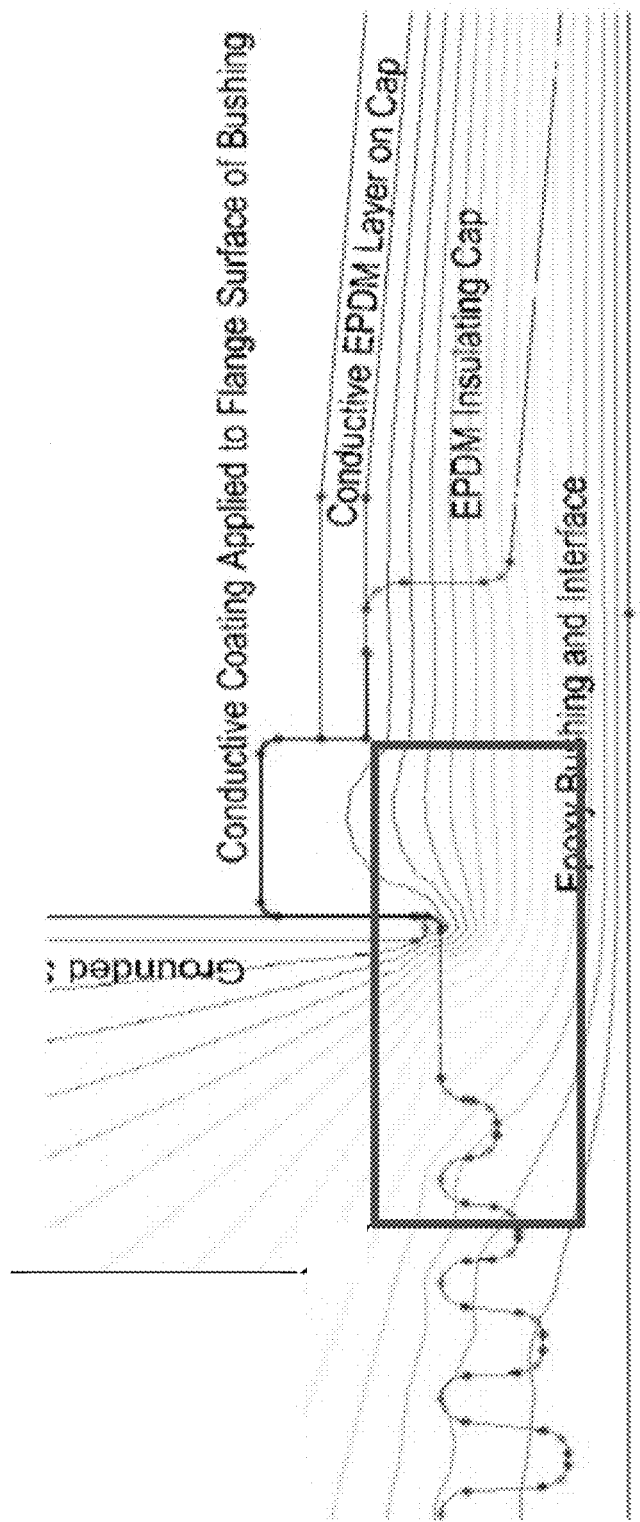
FIG. 12 is an enlarged region of the electrical stress model of FIG. 11 with the prior art bushing.
Figure 13:
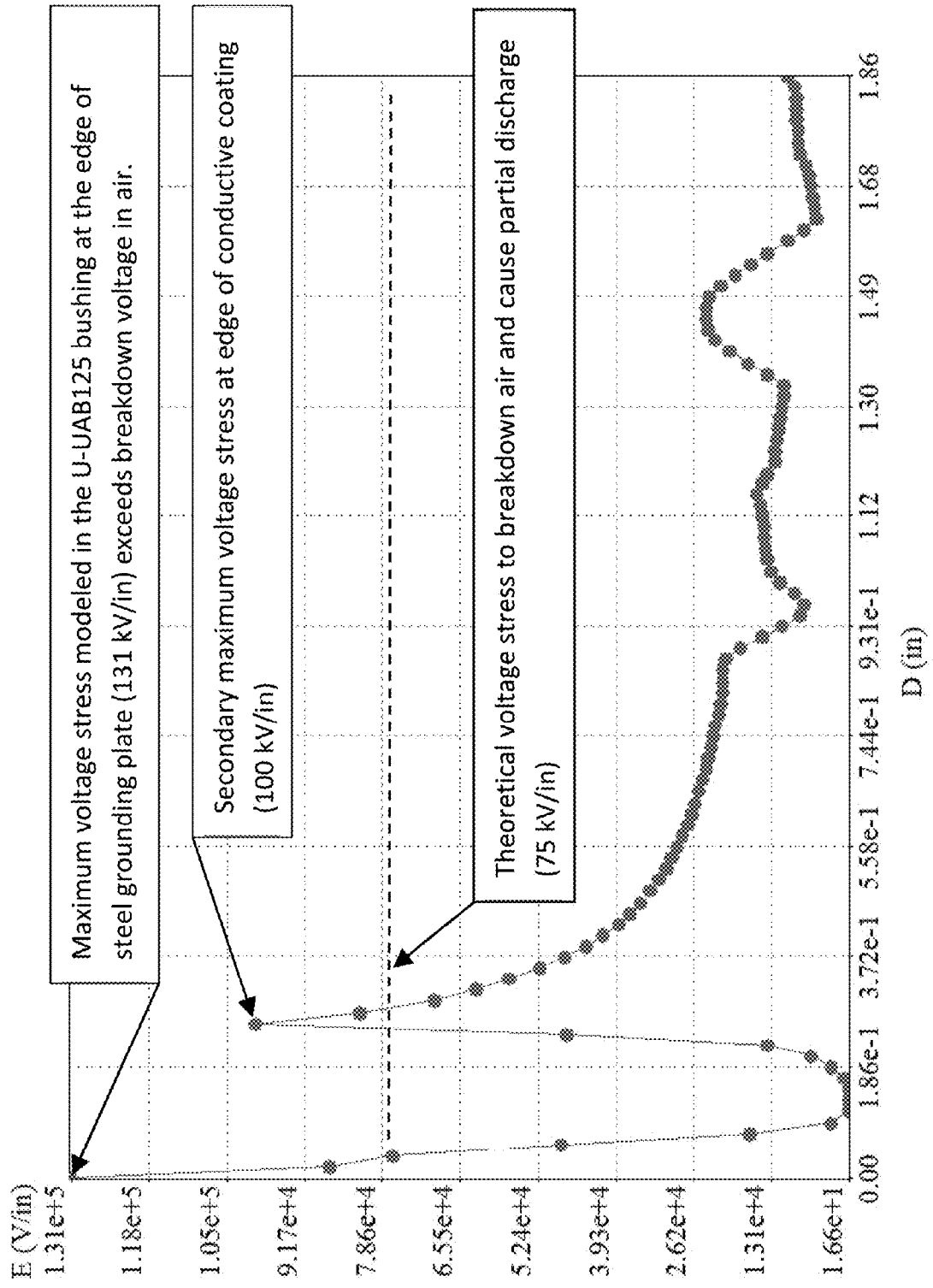
FIG. 13 is a graph of the voltage stress resulting from the change in voltage across the surface of the epoxy bushing as modeled in FIG. 11 with the prior art bushing.
Figure 14:
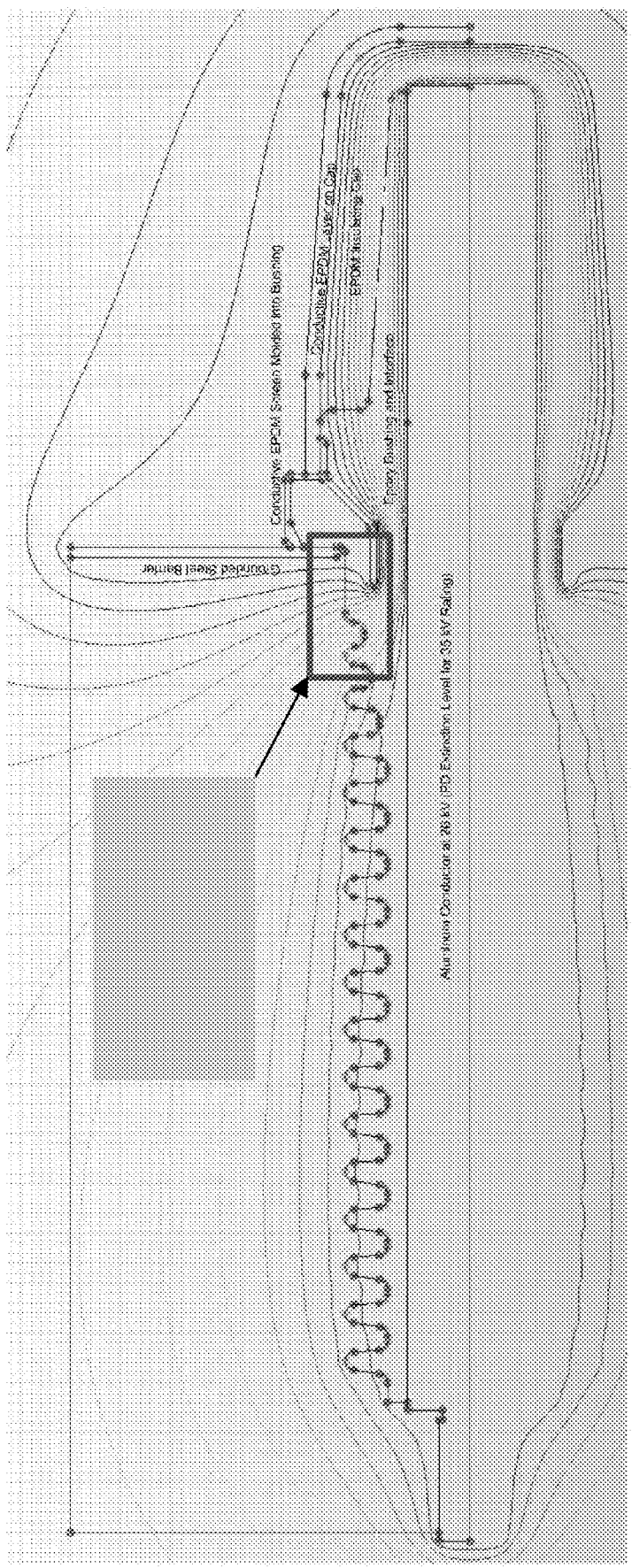
FIG. 14 illustrates the electrical stress predicted by a boundary element analysis simulating voltage contours resulting from the test station of FIG. 10 testing the bushing of FIG. 1.
Figure 15:
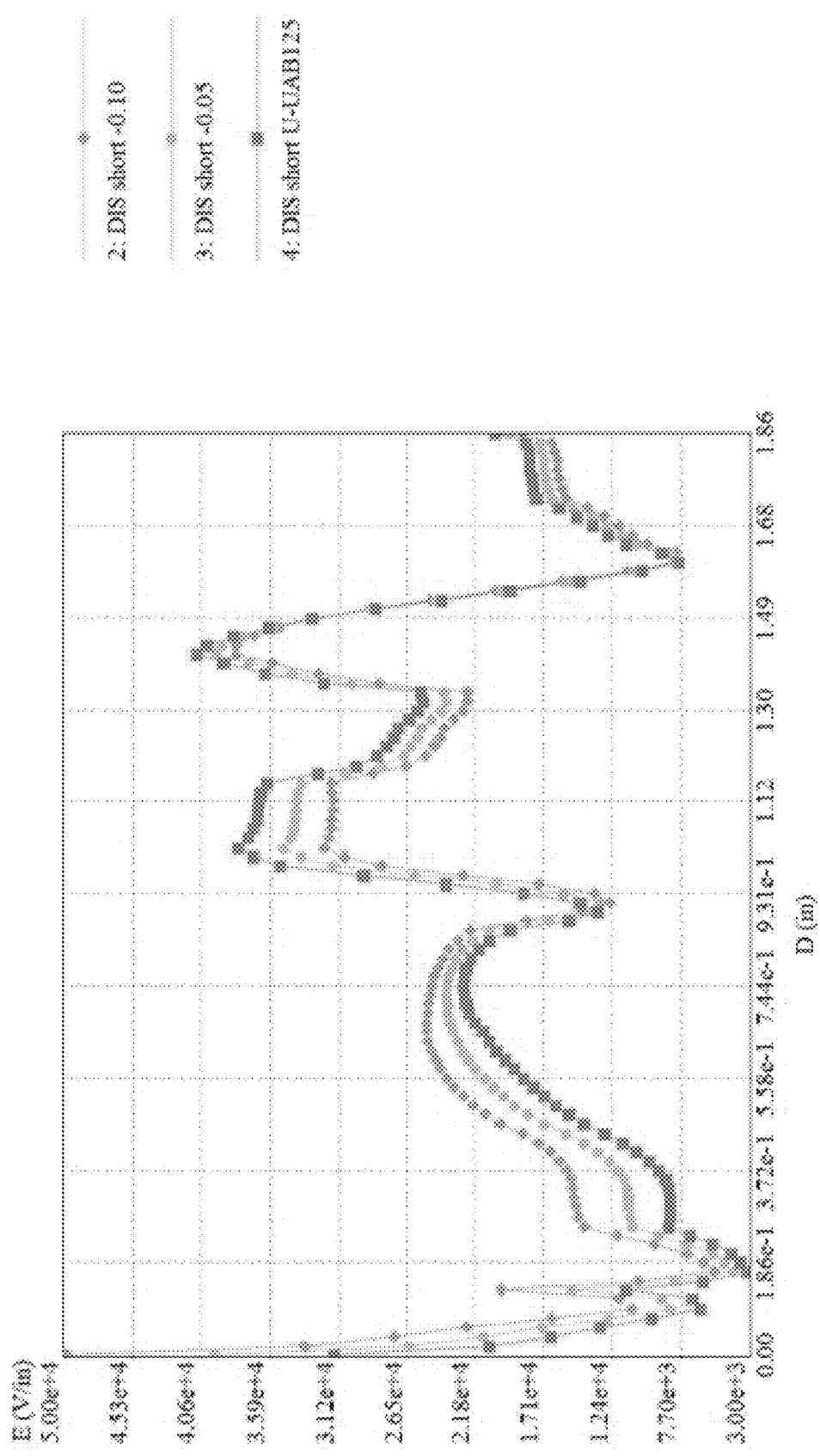
FIG. 15 is a graph of the voltage stress resulting from the change in voltage across the surface of the epoxy bushing as modeled in FIG. 14 with the bushing of FIG. 1.

The results of modeling the prior art bushing are seen in FIGS. 11-13 and the results of bushing 10 are seen in FIGS. 14-15.

During initial testing, the prior art bushing was energized to 120% of the partial discharge minimum extinction voltage associated with 15 kV rated parts based on Table 2 of IEEE 386-2016 Standard for Separable Insulated Connector Systems for Power Distribution Systems Rated 2.5 kV through 35 kV.

Because the measured partial discharge (PD) exceeded the allowable 5 pC, the voltage was reduced to the minimum extinction voltage specified (11 kV). With PD still measuring at 250 pC, exceeding the allowable 5 pC level, the voltage was further lowered until extinction of PD was achieved. In this case, the extinction voltage was measured at 7 kV, which is 36% below the required minimum voltage of 11 kV, per the applicable standard.

An electrical voltage stress model was prepared and run using Integrated Engineering Software's Electro V64 program to visualize the area of high voltage stress that was causing the PD. This software uses boundary element analysis to simulate real world conditions in electrical products. FIG. 11 shows a cross-section of the bushing assembly mounted on a grounded steel plate (simulating a field installation). As described in FIG. 11, the voltage level of the conductor was initially established at 19 kV, which is the minimum PD extinction level for a 25 kV rated bushing. The painted conductive coating and the steel mounting plate are set to ground potential (0 volts). The voltage drops from high potential at the conductor to zero potential at the coating on the bushing flange, the conductive layer on the insulating cap, and the steel mounting plate. These contours are closest together in the area indicating the highest voltage stress.

FIG. 12 provides a zoomed image of the area with the closest contour lines exposed to air. This stressed area has the greatest potential to breakdown, becoming partially conductive, causing partial discharge. A typical breakdown voltage for air is believed to be 3 kV/mm (or 75 kV/inch). FIG. 12 is an enlarged image of modeling results, highlighting area with maximum voltage stress exposed to air at the edge of the steel grounding plate and edge of conductive coating FIG. 13 is a graph of the voltage stress along the surface of the epoxy bushing, beginning at the edge of the conductive coating on the prior art bushing and continuing across to the second shed of the bushing. The voltage stress calculated by the modeling program indicates that the stress is highest at the immediate edge of the steel grounding plate and a secondary peak is apparent at the edge of the conductive coating. The voltage stress gradually deceases with increased distance from the coating. The peak levels of stress are significantly higher than the theoretical voltage stress to breakdown air and cause partial discharge. FIG. 13 is a plot of the voltage stress modeled along the surface of the epoxy on the prior art bushing assembled with a mating insulating cap, mounted on a grounded steel plate, and energized to 19 kV The physical testing and modeling of the prior art bushing indicates that PD can be expected at voltage levels below the criteria of the industry standard for these bushings.

As described below with respect to FIGS. 14-15, testing shows significant improvement to PD performance with bushing 10, which achieved a 35 kV PD extinction voltage. This is a 400% improvement over the prior art bushing PD extinction voltage of 7 kV, and a 16 kV margin over the required 19 kV extinction voltage for a 25 kV rated part.

To verify that these findings, the Electro modeling software was once again employed to visualize the voltage stress being developed in bushing 10. FIG. 14 depicts the contours of voltage across a sectioned view of bushing 10 assembled in the same manner as previously modeled in FIG. 11.

FIG. 15 provides a plot of the voltage stress across the same external surface of bushing 10 that was previously plotted for the prior art bushing in FIGS. 11-12. For this test of bushing 10, the voltage applied to the bushing was increased to 26 kV, the minimum extinction voltage required in a 35 kV rated apparatus bushing used in a separable connectors application. As the plot shows, even at the increased voltage, the stress at the edge of the steel plate is reduced to approximately 31 kV/inch, and at the edge of the screen 12, it is reduced to approximately 11 kV/inch. At the same time, the stress at the sheds of the bushing have increased from 25 kV/inch to 40 kV/inch.

FIG. 15 shows the results of different designs of screen 12 with different overall internal lengths. For the screen 12 with the middle overall length (1.075 inch for DIS short −0.05) the minimum voltage stress was determined. With this geometry screen 12, the peak stresses are 39.7 kV/inch at the edge of the grounded steel plate, 15.1 kV/inch at the edge of screen 12, and 39.5 kV/inch at the sheds of the bushing.

Figure 16:
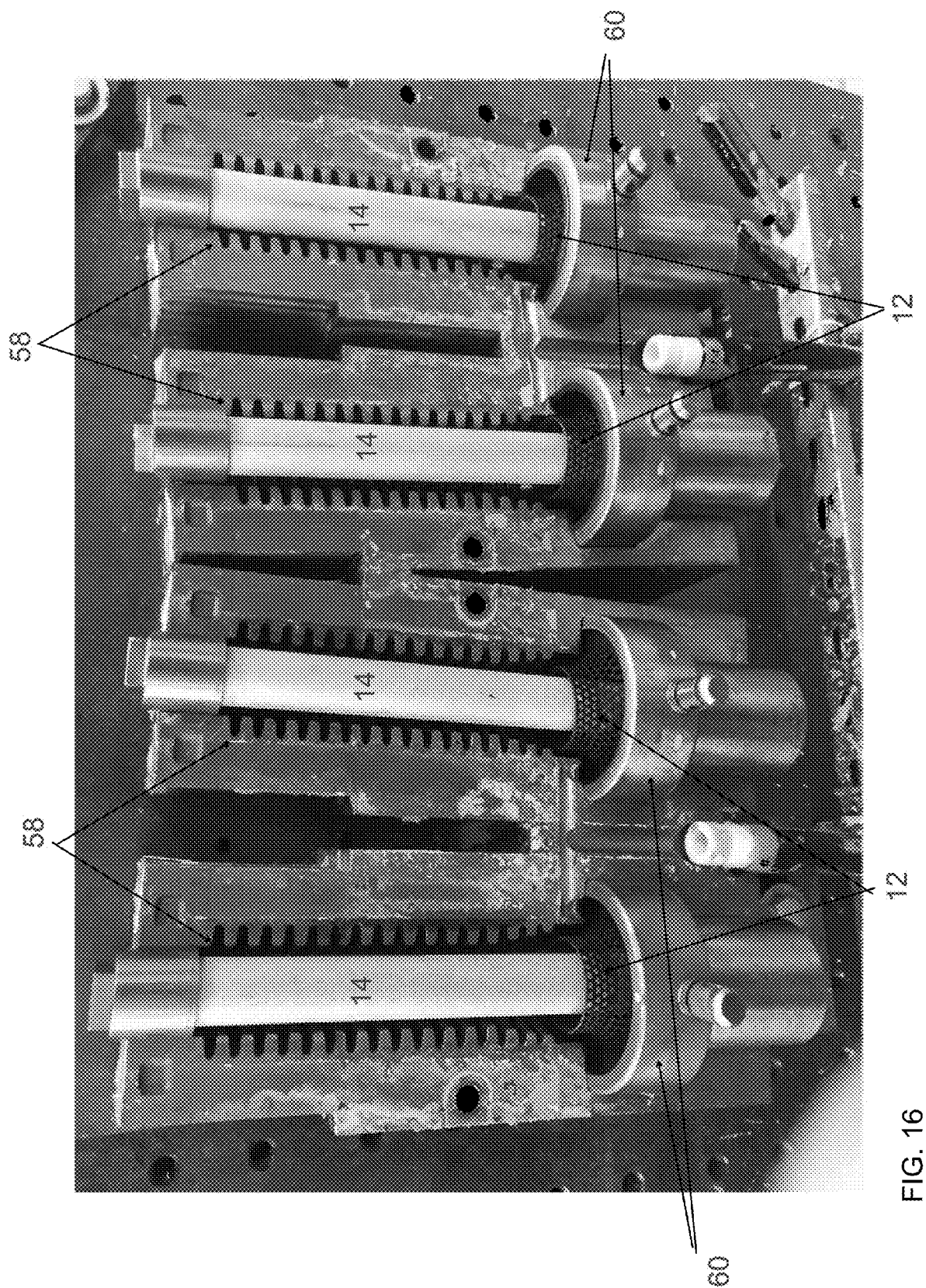
FIG. 16 is a schematic depiction of a molding process for molding the bushing of FIG. 1.

Referring now to FIG. 16, a molding process for molding bushing 10 is shown. Here, screen 12 and conductor 14 are shown installed in a mold cavity 58, where the mating mold cavity is not shown for ease of discussion.

Screen 12 is seated or dropped into a cup portion 60. Here, an outer surface of screen 12—namely at least longitudinal portion 38 of second region 20—is seated against the inner surface of cup portion 60 in a manner that prevents flow of the material used to form insulator body 16 from flowing between the screen and the mold cavity. Instead, the material used to form insulator body 16 flows through holes 28 in screen 12. In some embodiments, screen 12 is formed of EPDM having a hardness, Shore A, of 30-90 that ensures the screen is seated in cup portion 60.

Advantageously, screen 12 is properly located in cup portion 60 by simply being seated or dropped into the cup portion prior to preheating for molding. During molding, preheating results in screen 12 expanding with respect to cup portion 60 to seal the screen in the cup portion. In this manner, second region 20 functions as a locating feature when placing screen 12 into cup portion 60 and furthermore functions as the exterior insulation around flange 22—eliminating the additional coatings of the prior art.

Next, cup portion 60 is placed in mold cavity 58 and conductor 14 is inserted through screen 12 and into cavity 58 as shown in FIG. 16. Then, the second portion of the mold cavity (not shown) is placed in position over cup 60 having screen 12 there and over conductor 14. Finally, cycloaliphatic epoxy resin-based material is injected into the mold so as to mold insulating body 16 over screen 12 and conductor 14 using a pressure gelation process.

It should also be noted that the terms "first", "second", "third", "upper", "lower", and the like may be used herein to modify various elements. These modifiers do not imply a spatial, sequential, or hierarchical order to the modified elements unless specifically stated.

While the present disclosure has been described with reference to one or more exemplary embodiments, it will be understood by those skilled in the art that various changes may be made and equivalents may be substituted for elements thereof without departing from the scope of the present disclosure. In addition, many modifications may be made to adapt a particular situation or material to the teachings of the disclosure without departing from the scope thereof. Therefore, it is intended that the present disclosure not be limited to the particular embodiment(s) disclosed as the best mode contemplated, but that the disclosure will include all embodiments falling within the scope of the appended claims.

What is claimed is:

1. An electrical bushing, comprising:
   a conductor;
   a conductive polymer screen; and
   an insulating body, the conductive polymer screen having a first region and a second region, the insulating body being molded over at least a portion of the conductor and being molded over the first region of the screen, the second region of the screen extends outward from the insulating body to define an exterior flange.

2. The bushing of claim 1, wherein the insulating body is epoxy.

3. The bushing of claim 2, wherein the epoxy is cycloaliphatic epoxy.

4. The bushing of claim 1, wherein the conductive polymer screen comprises ethylene propylene diene monomer rubber.

5. The bushing of claim 1, wherein the first region comprises holes defined therethrough configured to shape an electrical field of the bushing.

6. The bushing of claim 5, wherein the holes are configured to shape the electrical field by a feature selected from a group consisting of a size, a shape, a pattern, and any combinations thereof.

7. The bushing of claim 5, wherein the holes have a radiused edge that faces internal to screen.

8. The bushing of claim 1, wherein the second region comprises a radial portion and a longitudinal portion that define an exterior of a flange.

9. The bushing of claim 8, wherein the longitudinal portion comprises a free end with an internal bevel.

10. The bushing of claim 8, wherein the second region further comprises a second longitudinal portion that extends in a direction away from the flange.

11. An electrical bushing consisting of a conductor, a conductive polymer screen, and an insulating body, the insulating body being molded over at least a portion of the conductor and being molded over a first region of the screen, the screen having a second region that extends outward from the insulating body to define an exterior flange.

12. The bushing of claim 11, wherein the insulating body is epoxy.

13. The bushing of claim 12, wherein the epoxy is cycloaliphatic epoxy.

14. The bushing of claim 11, wherein the conductive polymer screen comprises ethylene propylene diene monomer rubber.

15. A method of forming an electrical bushing, comprising:
    seating a conductive polymer screen in a cup portion of a mold so that an outer surface of the screen is seated against an inner surface of the cup portion;
    inserting a conductor into the mold and through the screen;
    closing the mold; and
    injecting an insulator material into the mold so that the insulator material flows through holes in a first region of the screen, the insulator material forming an insulator body over at least a portion of the conductor and over the first region of the screen, the outer surface forming part of a second region of the screen that extends outward from and over an outer portion of the insulating body.

16. An electrical bushing, comprising:
    a conductor;
    a conductive polymer screen having a first region and a second region; and
    an insulating body, wherein at least a portion of the conductor and the first region of the screen are encased in and form an integral unit with the insulating body, and wherein the second region of the screen extends outward from the insulating body to define an exterior flange.

17. The bushing of claim 16, wherein the insulating body is epoxy.

18. The bushing of claim 16, wherein the epoxy is cycloaliphatic epoxy.

19. The bushing of claim 16, wherein the conductive polymer screen comprises ethylene propylene diene monomer rubber.

* * * * *